United States Patent
Tsai et al.

(10) Patent No.: US 6,368,974 B1
(45) Date of Patent: Apr. 9, 2002

(54) SHRINKING EQUAL EFFECT CRITICAL DIMENSION OF MASK BY IN SITU POLYMER DEPOSITION AND ETCHING

(75) Inventors: Ming-Huan Tsai, Chu-Pei; Chan-Lon Yang, Taipei, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/365,416

(22) Filed: Aug. 2, 1999

(51) Int. Cl.$^7$ .............................................. H01L 21/311
(52) U.S. Cl. ...................... 438/695; 438/714; 438/725
(58) Field of Search ................................ 438/695, 424, 438/714, 723, 725, 706, 707

(56) References Cited

U.S. PATENT DOCUMENTS

| | | | | |
|---|---|---|---|---|
| 4,793,897 A | * | 12/1988 | Dunfield et al. | 156/643 |
| 6,030,881 A | * | 2/2000 | Papasouliotis et al. | 438/424 |
| 6,071,372 A | * | 6/2000 | Ye et al. | 156/345 |

* cited by examiner

Primary Examiner—Benjamin L. Utech
Assistant Examiner—Kin-Chan Chen

(74) Attorney, Agent, or Firm—Lowe Hauptman Gilman & Berner, LLP

(57) ABSTRACT

A method for shrinking equivalent critical dimension of mask by in situ polymer deposition and etching is proposed. The invention comprises following key points: First, when a photo-resist is formed on a substrate by a mask and a photolithography process, a polymer layer is formed on said photo-resist. Second, a plasma reactor with at least two independent power sources is used to form and etch the polymer layer, where ion density and ion energy of plasma are adjusted respectively by different power sources. Third, voltages of all power sources are adjusted such that etching rate and depositing rate are equivalent on surface of the photo-resist and etching rate is obviously larger than depositing rate in bottom of any structure of the photo-resist. Therefore, the sidewall of any structure is filled by a conformal polymer layer and then width of any structure is efficiently decreased. By the way, the critical dimension of any structure is significant smaller than critical dimension of the mask. In other words, equivalent critical dimension of mask is shrunk by the invention. Obviously, the photo-resist with shrunk critical dimension can be used to form semiconductor device with critical dimension that is more narrow than critical dimension of the mask.

22 Claims, 5 Drawing Sheets

SHRINKING EQUAL EFFECT CRITICAL DIMENSION OF MASK BY IN SITU POLYMER DEPOSITION AND ETCHING

BACKGROUND OF THE INVENTION

1. Field of the Invention

The present invention relates to the decrease of critical dimension of a semiconductor fabrication, and more particularly relates to a method that shrinks equivalent critical dimension of mask by In situ polymer deposition and etching on a photo-resist.

2. Description of the Prior Art

Critical dimension (CD) is a key factor of semiconductor device fabrication, it means the narrowest width that the photolithography process can achieve. Obviously, critical dimension is significantly decreased as scales of semiconductor products are continuously decreased.

In well-known techniques, methods for shrinking critical dimension can be divided into three principal categories: lithography method, photo-resist re-flow method and polymer deposition method. Where lithography method shrinks CD of semiconductor products by directly shrinking CD of mask and other methods shrinks CD of semiconductor products by shrinking CD of photo-resist.

Lithography method is the conventional method as FIG. 1A shows that pattern of mask 10 is totally transformed to photo-resist 11 that locates on substrate 12 by light 101 from a first light source, where the CD (W1) of mask 10 is equal to CD (W2) of photo-resist 11. The basic spirit of the method is that diffraction effect can be suppressed by reducing wavelength of light and resolution can be improved by reduction of wavelength of light. For example, 0.3 $\mu$m CD corresponds to 365 nm wavelength, 0.2 $\mu$m CD corresponds to 248 nm wavelength and 0.18 $\mu$m CD corresponds to 193 nm wavelength. Therefore, as FIG. 1B shows, when the first light source is replaced by a second light source, pattern of mask 105 is totally transformed to photo-resist 115 that locates on substrate 126 by a light 102 from the second light source, where the CD (W3) of mask 105 is equal to CD (W4) of photo-resist 115. No matter how, owing to the fact that wavelength of light 102 is shorter than wavelength of light 11, the CD (W3) of mask 105 is smaller than the CD (W1) of mask 10.

In addition, two disadvantages of shrinking wavelength are inevitable: First, owing to the fact that depth of focus is proportion to wavelength, when thickness of photo-resist is non-negligible then short wavelength will induce non-uniform structure of structure of photo-resist and will decrease throughput of lithography process. Second, development of new light source with short wavelength is difficult, expensive and time-consuming. Beside, total lithography system must be re-designed for new short wavelength source.

In comparison, two rectified lithography methods are provided. One is phase shift mask method and the other is the off-axis illumination method. Both methods are shrinking CD by modifying property of mask such as structure and location, and it is not required to lower the wavelength of light.

In short, the phase shift mask method improves resolution of a mask by forming a shift layer on the mask to enhance constructive interference of light and reduce destructive interference of light. In comparison, off-axis illumination method improves resolution of mask by changing incidental angle between light and mask to prevent zero order diffract light vertically incident to a photo-resist and to change angle between different diffract lights. Obviously, both methods have a primary difficulty that required photography system is complicated and expensive.

Photo-resist re-flow method is a two-steps method to form narrow CD photo-resist by wide CD mask. First, as FIG. 1C shows, transforms pattern of mask 13 to a photo-resist 14 by light 135, where photo-resist 14 locates on substrate 15 and light 135 is emitted from a specific light source. Second, heat treats photo-resist 14 such that photo-resist 14 is melted and re-distributed, as shown in FIG. 1D. Obviously, by comparing FIG. 1C and FIG. 1D, during the heat treat process, each structure 17 of photo-resist 14 is filled by re-distributed surrounding photo-resist 14 and then CD of photo-resist 14 is smaller than CD of mask 13.

Polymer deposition method is another two-steps method to form narrow CD photo-resist by wide CD mask. First, light 175 from a specific light source is used to transform pattern of mask 17 to photo-resist 18 that covers substrate 19, as FIG. 1E shows. Second, as shown in FIG. 1F, polymer layer 193 is formed on photo-resist 18 and then each structure 196 of photo-resist 18 is filled by polymer layer 193. Therefore CD of photo-resist 18 is decreased by polymer layer 193. In addition, the useful method to form polymer layer 193 is the chemical mechanical deposition (CVD) method.

No matter how, both two-steps methods correspond to some disadvantages respectively. These disadvantages of photo-resist re-flow method comprise heat treat process and outline of structure 17 with re-distributed photo-resist 14 are difficult to control, effect of the method is not controllable and total fabricate process is increased. In comparison, disadvantages of polymer deposition method comprise effect of following etching process is decreased by polymer layer 193 that formed on bottom of structure 196, distribution of polymer layer 18 is difficult to be conformal and throughput of semiconductor fabrication is decreased by the forming process of polymer layer 193. Obviously, the advantage of these two-steps method that photo-resist with narrow CD is formed by mask with wide CD without reducing wavelength of light is cancelled by these disadvantages.

Therefore, according to previous paragraphs, it is indisputable that shrinking critical dimension is an important object in the development of semiconductor device fabrication, and it is particularly desired to develop a method that not only shrinks critical dimension but also prevents these previous disadvantages of well-known methods.

SUMMARY OF THE INVENTION

The primary object of the invention is to propose a method that efficiently shrink critical dimension of semiconductor device fabrication.

Another object of the invention is to form narrow CD photo-resist with wide CD mask. In other words, though CD of mask is not shrunk, but equivalent critical dimension is shrunk by shrinking critical dimension of photo-resist.

A further object of the invention is to avoid difficulties about development of narrow wavelength light source and improvement of photography system.

A still further object of the invention is to efficiently shrink CD of photo-resist when pattern of mask is totally and precisely transformed to photo-resist.

A yet further object of the invention is to propose a method not only shrinks CD of semiconductor device fabrication but also maintains throughput of semiconductor device fabrication in high level.

In order to achieve previous objects of the invention. A method comprises following essential points are proposed:

First step, forms a photo-resist on a substrate by a mask and a photolithography process, where pattern of the mask is totally and precisely transformed to the photo-resist and then CD of mask is equal to CD of photo-resist.

Second step, a plasma reactor with at least two independent power sources is used to form and etch a polymer layer on the photo-resist, where ion density and ion energy of plasma are adjusted respectively by different power sources.

Third step, adjusts voltages of all power sources such that etching rate and depositing rate are equivalent on surface of the photo-resist and etching rate is obviously larger than depositing rate in bottom of any structure of the photo-resist. Therefore, each structure is filled by a conformal polymer layer and then width of each structure is efficiently decreased. Thus, the critical dimension of the photo-resist is significant smaller than critical dimension of the mask. In other words, equivalent critical dimension of mask is shrunk by the invention. Beside, polymer layer does not be formed on bottom of any structure, and then following process such as etching is not obstructed by the polymer layer.

Indisputably, the idea of the invention is shrinking equivalent critical dimension of mask by In situ polymer deposition and etching on a photo-resist.

Obviously, the proposed method is an improved conventional polymer deposition method, and primary improvements comprise (1) both deposition and etching are used to form the polymer layer, (2) polymer layer does not be formed on bottom of any structure of the photo-resist.

Of course, when critical dimension of photo-resist is shrunk, any following process such as etching and deposition can be used to form semiconductor device with small critical dimension.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

First, provides mask 20 that has a pattern corresponds to a plurality of lines and a plurality of holes. Wherein pattern of mask 20 corresponds to at least one semiconductor structure and available varieties of the semiconductor structure comprise contact, interconnect and gate. In addition, critical dimension of mask 20 is W5

Figure 1A:
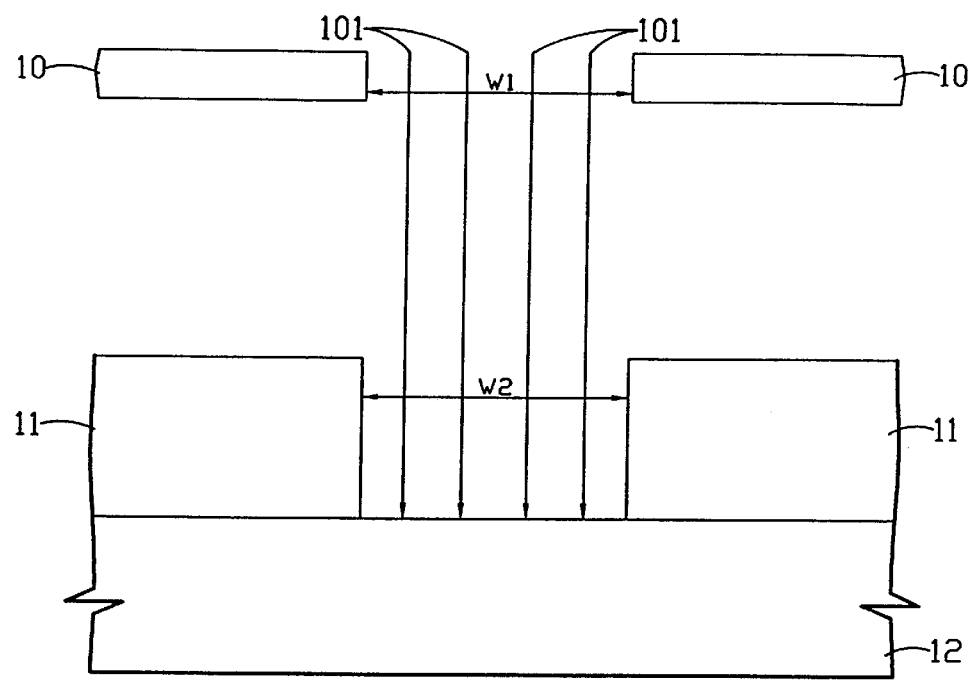
FIG. 1A to FIG. 1B are brief qualitative figures that show a conventional method to shrink critical dimension by decreasing wavelength of light source.
Figure 1B:
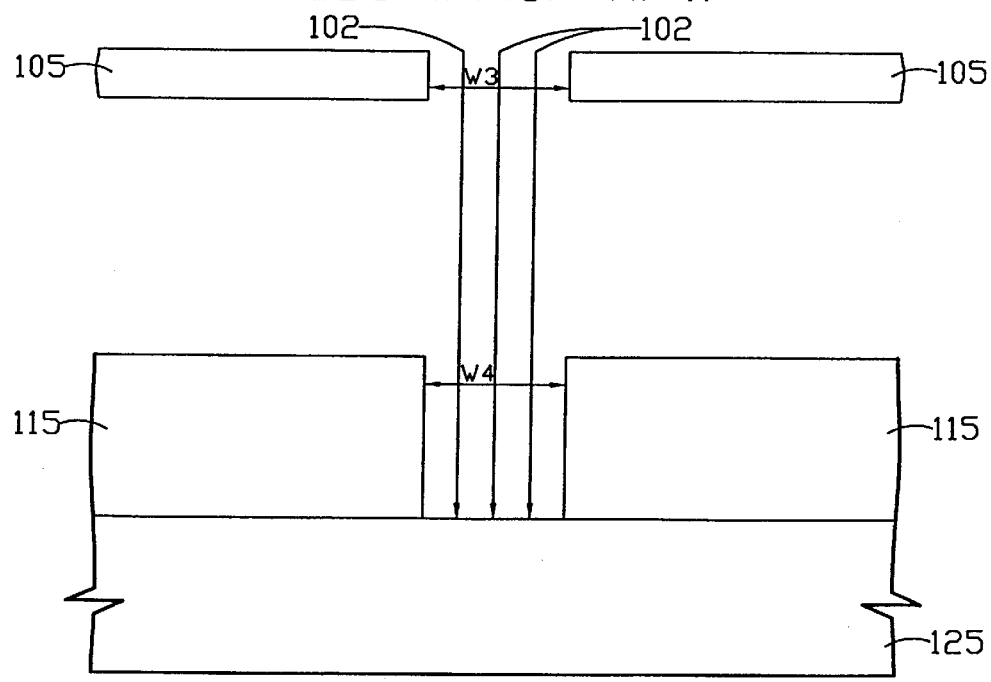
Figure 1C:
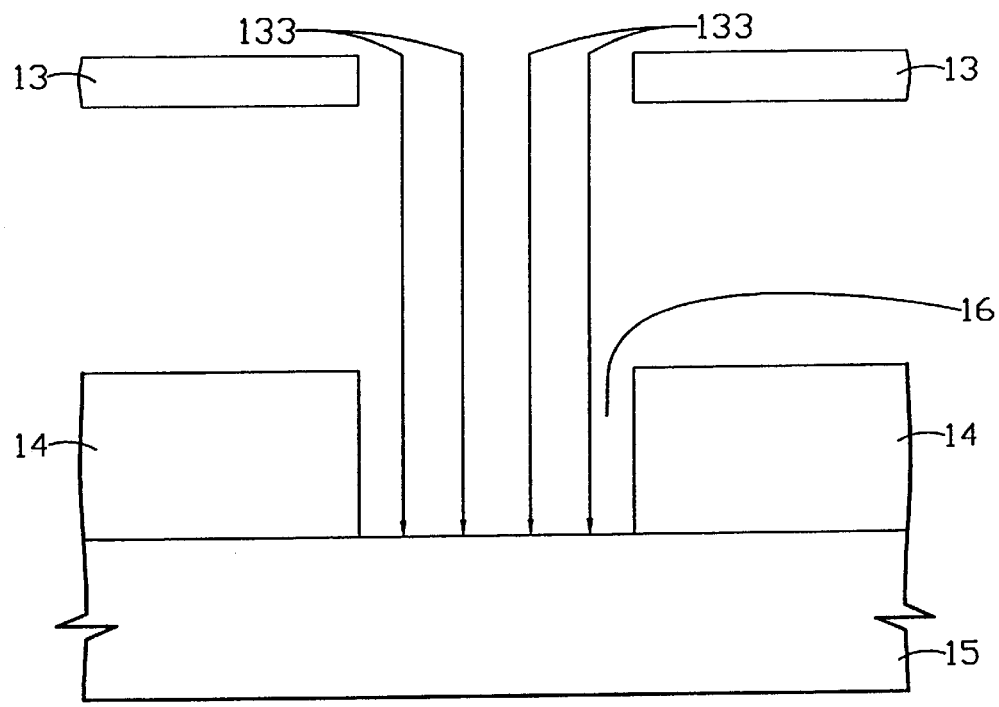
FIG. 1C to FIG. 1D are brief qualitative figures about a conventional method that shrinks critical dimension by re-flow of photo-resist.
Figure 1D:
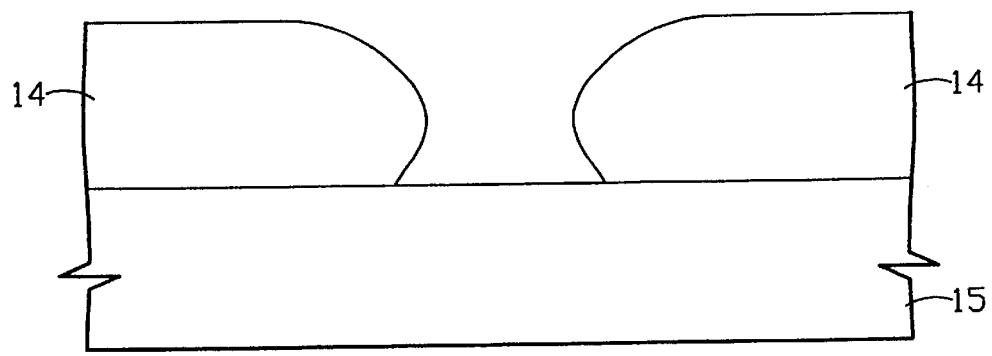
Figure 1E:
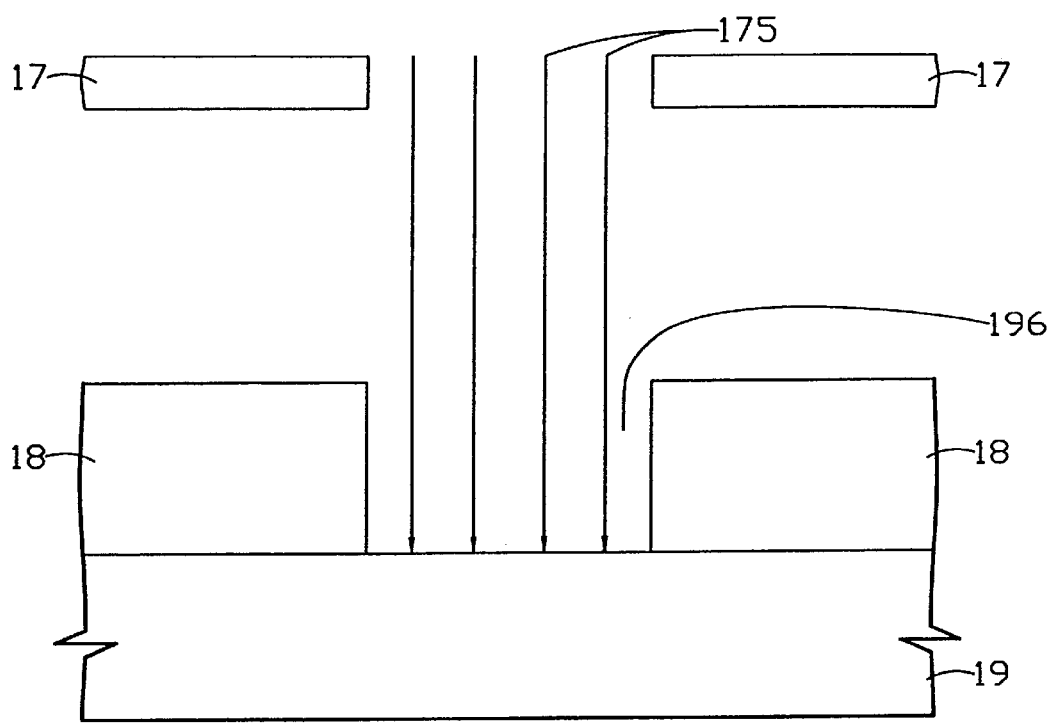
FIG. 1E to FIG. 1F are brief qualitative figures about another conventional method that shrinks critical dimension by covering a polymer layer on the photo-resist.
Figure 1F:
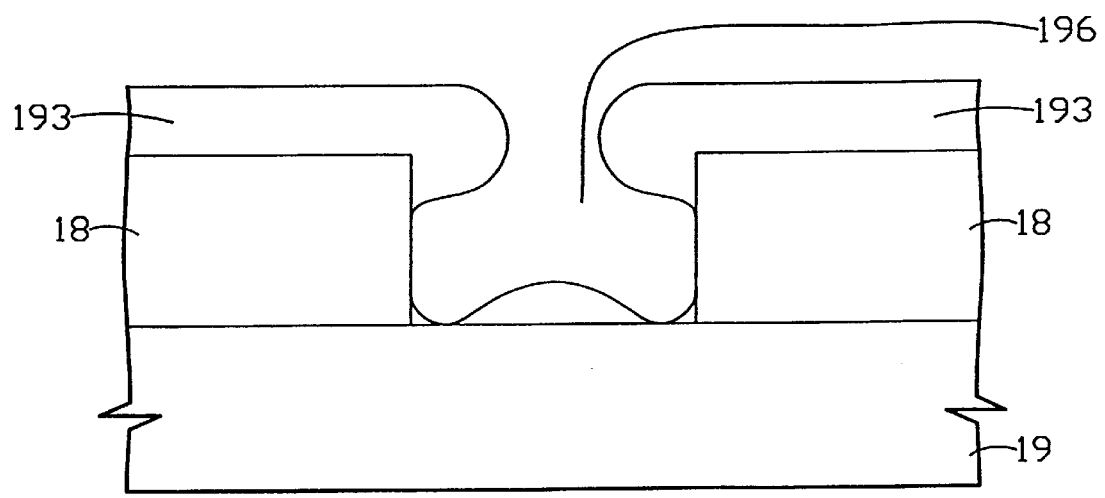
Figure 2A:
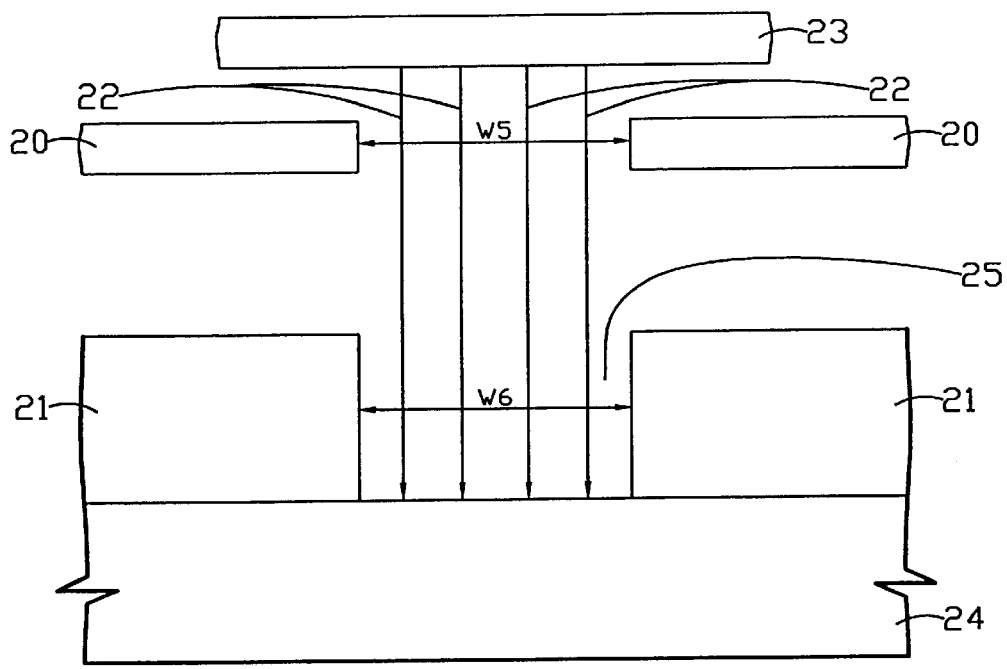
FIG. 2A to FIG. 2C are a series of brief qualitative figures about different steps of shrinking critical dimension which are according to one embodiment of the proposed invention, where only part of pattern of the mask and the photo-resist is illustrated.

Second, as FIG. 2A shows, pattern of mask 20 is totally and especially transformed to photo-resist 21 by a photolithography process with light 22 from light source 23, where photo-resist 21 covers substrate 24. Moreover, each structure 25 in photo-resist 21 corresponds to a specific aspect respectively where available varieties of structure 25 comprises gap, hole and line, and critical dimension W6 of photo-resist 21 is equal to W5. Beside, substrate 24 comprises at least one semiconductor element such as metal oxide semiconductor transistor, capacitor and isolation. Incidentally, components of photo-resist 21 comprise resin, sensitizer and solvent, and thickness of photo-resist 21 is about from several angstroms to several $\mu$ms.

Third, puts substrate 24 with photo-resist 21 into a plasma reactor that has a plurality of independent power sources. Herein, substrate 24 and photo-resist 21 react with a plasma that produced by the plasma reactor. Moreover, ion density of said plasma and ion energy of the plasma could be adjusted separately for they are controlled by different power source.

In short, available varieties of the plasma reactor comprise inductively coupled plasma reactor and capactively coupled plasma reactor. In addition, a first power source of the plasma reactor is used to generate and to adjust density of the plasma, and a second power source of the plasma reactor is used to product and to adjust a DC bias near surface of substrate 24. In general, the first power source is provided by radio frequency (RF) power of inductance coil or a pair of RF power of capacitance plates, and the second power source is provided by RF power of cathode.

Figure 2B:
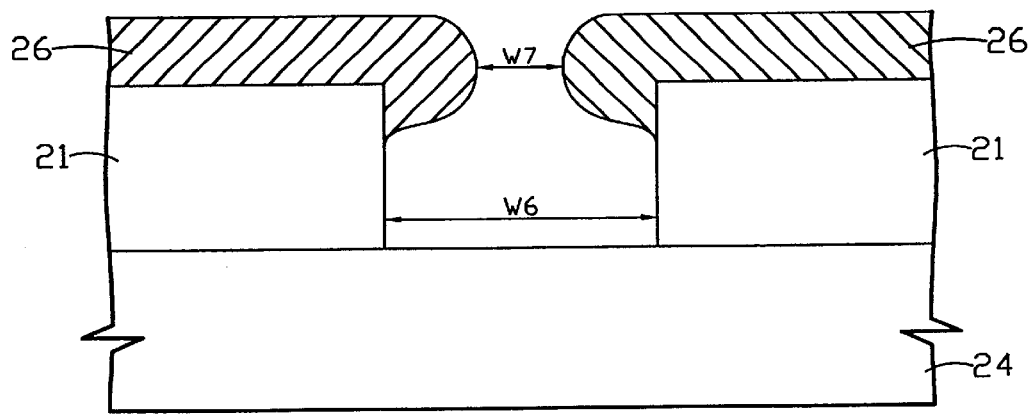

Fourth, as FIG. 2B shows, forms polymer layer 26 on photo-resist 21 by the plasma reactor, where material of polymer layer 26 is selected from following group: carbon fluoride, carbon hydrogen fluoride and carbide.

However, it should be noted that both depositing process and etching process are executed in the plasma reactor simultaneously and in situ. Thus, owing to the fact that depositing rate is higher in surface of photo-resist 21 but is lower in each structure 25, and etching in surface of photo-resist 21 is almost equal to etching rate in each structure 25. It is obvious that polymer layer 26 not only fills each structure 25 with good step coverage but also does not covers bottom of each structure 25.

Therefore, aspect of each structure 25 is increased by polymer layer 26 and then critical dimension of photo-resist 21 is shrunk by polymer layer 26 from W5 to W6.

By the way, when RF power of cathode is zero, polymer will deposit on surface of photo-resist 21 and bottom of each structure 25, and then it is pure polymer deposition mode as conventional polymer deposition method.

It should be noted that in previous In situ deposition and etching process, pressure inside the plasma reactor is low and voltage of the DC bias is not zero but is moderate low, where a typical pressure is less than about 100 mTorrs.

Anyway, it is crystal-clear that the proposed invention is an improved polymer deposition method. And the most important r improvement is that polymer is formed by a plasma reactor with at least two independent power source where both depositing process and etching process are executed simultaneously. Therefore, etching process and deposition process could be adjusted to let bottom of each structure 25 does not covered by polymer, and then basic disadvantages of conventional polymer deposition method is improved.

Obviously, owing to the fact that critical dimension of photo-resist 21 is shrunk without shrinking critical dimension of mask 20. It can be say that equivalent critical dimension of mask 20 is efficiently decrease by the invention that In situ deposition and etching polymer layer 26 on photo-resist 21.

Incidentally, by appropriating adjusting voltage of each power source and working condition of the plasma reactor, limitation of magnifying percentage of aspects of each structure 25 can approach to five hundreds percentages. In other words, equivalent critical dimension of photo-resist 21 with polymer layer 26 is approach to one fifth of critical dimension of mask 20. Therefore, it is crystal-clear that well-known light source such as 365 nm, 248 nm etc. and original mask with 0.3 $\mu$m to 0.5 nm critical dimension can be used to form semiconductor devices that correspond to about 0.1 $\mu$m critical dimension. In short, by the invention, critical dimension of any conventional semiconductor device can be efficiently shrunk without any improvement and development of new light source. Sequentially, the cost of semiconductor fabrication is dramatically decreased.

No matter how, detail values of voltage of each power source and working condition of the plasma reactor at least depend on layout of pattern of mask 20 and type of the plasma reactor, and no general rule between these parameters and critical dimension can be provided now.

Hereto, when bottom of each structure 25 does not be covered by polymer layer 26, the invention provide an obvious advantage that conventional polymer deposition method can not provide. In the invention, when following process such as etching is used to form semiconductor structure such as contact hole by photo-resist 21 with polymer-layer 26, no polymer layer 26 should be etched before substrate 24 is etched. Therefore, the etching process can be preformed with high selectivity between substrate 24 and polymer layer 26, and critical dimension W6 does not be increased by etching process that acts on polymer layer 26. In comparison, conventional polymer deposition method always deposits polymer on bottom of each structure 25, then not only polymer on bottom of each structure 25 must be removed before substrate 24 is etched, but also critical dimension 25 is increased by etching process that acts on polymer.

No matter how, because improved critical dimension W6 basically depends on the narrowest indentation of each structure 25 with polymer layer 26. It is indisputable that the only requirement is that substrate 24 vertical below the narrowest indentation of each structure 25 with polymer layer 26 does not covered by polymer layer 26. And then restriction on formation of polymer layer 26 is relaxed.

However, another important advantage of the invention is that because both deposition and etching can be In situ performed in the plasma reactor, when critical dimensional is efficiently decreased then etching can be performed by the same plasma reactor. In other words, fabricating process steps does not be increased by the proposed method and then throughput of semiconductor device fabrication still is kept in high level.

Figure 2C:
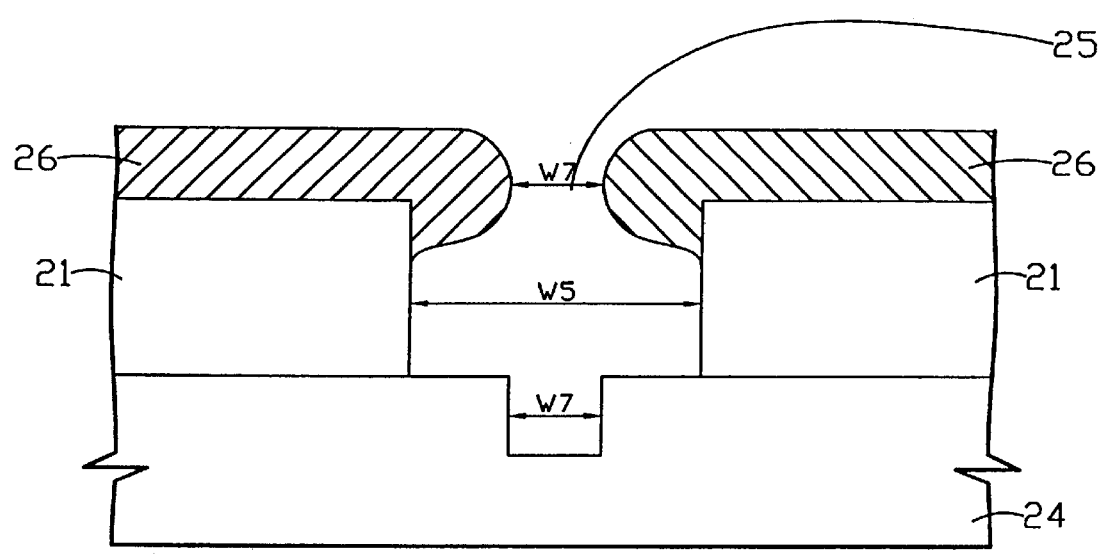

Fifth, as FIG. 2C shows, when critical dimension of photo-resist 21 is efficiently decreased by polymer layer 26, following process such as etching can be used to form semiconductor structure 27 with critical dimension that is narrower than critical dimension of mask 20. In addition, possible kinds of semiconductor structures 27 comprise contact hole, plug hole, and so on.

For example, when substrate 24 is covered by a dielectric layer and photo-resist 21 is formed on the dielectric layer. Then after critical dimension of photo-resist 21 is shrunk by polymer layer 26, voltages of these power sources could be adjusted to increase the DC bias such that dielectric layer is etched by plasma. And then a contact hole is formed inside the dielectric layer with a width that is less than critical width of mask 20. Finally, photo-resist is removed and substrate 24 can be treated by following semiconductor-fabricating process.

Of course, while this invention has been described in previous discussion, it is to be understood that the invention need not be limited to these disclosed embodiments. Various modification and similar changes are still possible within the spirit of this invention. In this way, the scope of this invention should be defined by the appended claims.

What is claimed is:

1. A method for shrinking critical dimension of a mask by In situ polymer deposition and etching on a photo-resist, comprising:

providing a mask, said mask having a pattern;

performing a photolithography process to transform said pattern of said mask into a photo-resist that is located on a substrate so let a plurality of holes and a plurality of lines be formed in said photo-resist, wherein each said hole and each said line has a respective aspect;

putting said substrate and said photo-resist into a plasma reactor which has a plurality of independent power sources and provide a plasma, wherein both the ion density of said plasma and the ion energy of said plasma can be adjusted separately; and forming a polymer layer on said photo-resist by the reaction between said plasma and said photoresist, wherein both depositing process and etching process are In-situ executed simultaneously, wherein said polymer layer not only fills said holes and said lines with good step coverage but also essentially does not cover the bottom of said holes and said lines.

2. The method according to claim 1, wherein pattern of said mask corresponds to at least one semiconductor structure, where available varieties of said semiconductor structure comprise contact, interconnect and gate.

3. The method according to claim 1, wherein said substrate comprises at least one semiconductor element, herein available varieties of said semiconductor element comprise metal oxide semiconductor transistor, capacitor and isolation.

4. The methods according to claim 1, wherein components of said photo-resist comprise resin, sensitizer and solvent.

5. The method according to claim 1, wherein thickness of said photo-resist is from about several angstroms to about several $\mu$ms.

6. The method according claim 1, wherein available varieties of said plasma reactor comprise inductively coupled plasma reactor and capactively coupled plasma reactor.

7. The method according to claim 1, wherein a first power source of said plasma reactor is used to generate and to adjust density of said plasma.

8. The method according to claim 7, where said first power source is generally provided by a radio frequency power of inductance coil or a pair of radio frequency power of capacitance plates.

9. The method according to claim 1, wherein a second power source of said plasma reactor is used to produce and to adjust a DC bias near surface of said substrate.

10. The method according to claim 9, wherein said second power source is generally provided by radio frequency power of cathode.

11. The method according to claim 1, wherein material of said polymer layer is selected from the group consisting of carbon fluoride, carbon hydrogen fluoride and carbide.

12. The method according to claim 1, wherein the pressure inside said plasma reactor and the voltage of a DC bias near the surface of said substrate are adjusted to let the polymer depositing rate be far larger than the polymer etching rate on surface of said photo-resist but the polymer depositing rate is far smaller than the polymer etching rate on bottom of said holes and bottom of said lines.

13. The method according to claim 12, wherein said pressure is less than about 100 mTorr.

14. A method for forming a contact hole by In situ polymer deposition and etching, where the critical dimension of said contact hole is narrower than the critical dimension of said mask, comprising:

providing a substrate, said substrate comprising a plurality of semiconductor structures and is covered by a dielectric layer;

preparing a mask, said mask has a pattern which at least corresponds to a contact hole;

performing a photolithography process to transform said pattern of said mask into a photo-resist that is located on said dielectric layer, thus, a contact hole being formed in said photo-resist and being correspond to a specific aspect;

putting said substrate and said photo-resist into a plasma reactor which has a plurality of independent power sources and forms a plasma, beside, both the ion density of said plasma and the ion energy of said plasma can be adjusted separately;

forming a polymer layer on said photo-resist by the reaction between said photo-resist and said plasma, wherein both the depositing process and the etching process are executed simultaneously, wherein said polymer layer fills said contact hole with good step coverage so let the critical dimension of said contact hole is decreased by said polymer layer; and adjusting the voltages of said power sources to increase a DC bias near the surface of said substrate so let said dielectric layer be etched by said plasma, and then a contact hole being formed in said dielectric layer with a width that is less than critical width of said mask.

15. The methods according to claim 14, wherein components of said photo-resist comprise resin, sensitizer and solvent.

16. The method according to claim 14, wherein thickness of said photo-resist is from about several angstroms to about several $\mu$ms.

17. The method according claim 14, wherein said plasma reactor is selected from the group consisting of inductively coupled plasma reactor and capacitively coupled plasma reactor.

18. The method according to claim 14, wherein a first power source of said plasma reactor is used to generate and to adjust density of said plasma, moreover, said first power source is provided by a radio frequency power of inductance coil or a pair of radio frequency power of capacitance plates.

19. The method according to claim 14, wherein a second power source of said plasma reactor is used to produce and to adjust a DC bias near surface of said substrate, moreover, said second power source is generally provided by RF power of cathode.

20. The method according to claim 14, wherein material of said polymer layer is selected from the group consisting of: carbon fluoride, carbon hydrogen fluoride and carbide.

21. The method according to claim 14, wherein the pressure inside said plasma reactor and the voltage of said DC bias are adjusted to let the polymer depositing rate be far larger than the polymer etching rate on surface of said photo-resist but the polymer depositing rate is far smaller than the polymer etching rate on bottom of said holes and bottom of said lines.

22. The method according to claim 21, wherein said pressure is less than about 100 mTorr.

* * * * *